(12) United States Patent
Plisch et al.

(10) Patent No.: US 6,842,486 B2
(45) Date of Patent: Jan. 11, 2005

(54) SIGNAL PROCESSING SYSTEM WITH BASEBAND NOISE MODULATION AND NOISE FOLD BACK REDUCTION

(75) Inventors: Marjorie R. Plisch, Austin, TX (US); John L. Melanson, Austin, TX (US); Stephen T. Hodapp, Austin, TX (US); Giri N. K. Rangan, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 51 days.

(21) Appl. No.: 10/425,285

(22) Filed: Apr. 29, 2003

(65) Prior Publication Data

US 2004/0141558 A1 Jul. 22, 2004

Related U.S. Application Data

(60) Provisional application No. 60/441,296, filed on Jan. 21, 2003.

(51) Int. Cl.[7] .................................. H04B 14/06
(52) U.S. Cl. ........................ 375/247; 341/143
(58) Field of Search ................... 375/247; 341/126, 341/143, 144–146; 370/215

(56) References Cited

U.S. PATENT DOCUMENTS

| | | | |
|---|---|---|---|
| 4,138,649 A | 2/1979 | Schaffer | 330/9 |
| 4,939,516 A | 7/1990 | Early | 341/143 |
| 5,039,989 A | 8/1991 | Welland et al. | 341/143 |
| 5,148,167 A | * 9/1992 | Ribner | 341/143 |
| 5,561,660 A | * 10/1996 | Kotowski et al. | 370/215 |
| 2004/0021594 A1 | * 2/2004 | Melanson | 341/143 |

* cited by examiner

Primary Examiner—Don N. Vo
(74) Attorney, Agent, or Firm—Hamilton & Terrile, LLP; Kent B. Chambers

(57) ABSTRACT

A digital-to-analog converter ("DAC") system utilizes chopping modulation technology to remove 1/f and other baseband noise from a baseband of a signal of interest. Chopping modulation and demodulation circuitry of the DAC operate at a chopping frequency equal to approximately one-half of a digital input signal sampling frequency. Chopping at one-half the sampling frequency allows fold back into the baseband of the input signal's frequency components and reduces fold back of noise, such as quantization noise, residing outside the baseband. In a further embodiment, a notch filter attenuates signals having frequencies around the chopping frequency prior to chopping to reduce fold back of noise into the baseband due to parasitic modulation. Coordination of chopping timing also reduces noises in the output of the DAC system.

29 Claims, 10 Drawing Sheets

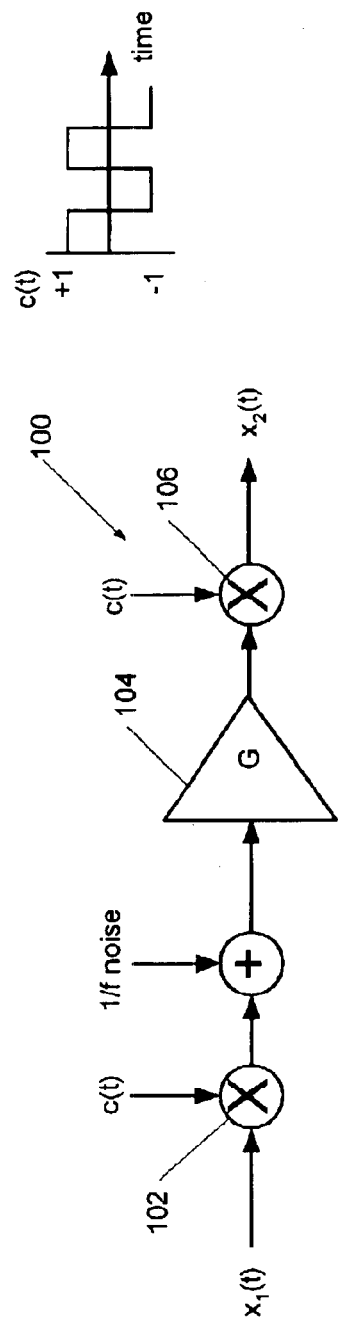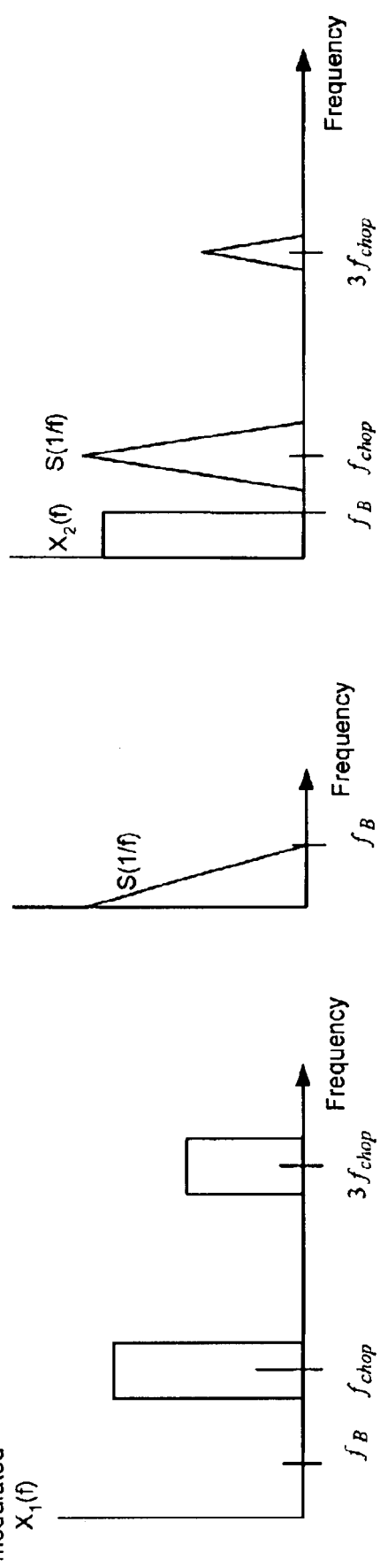
*Figure 1 (Prior Art)*
*Figure 2A (Prior Art)*
*Figure 2B (Prior Art)*
*Figure 2C (Prior Art)*

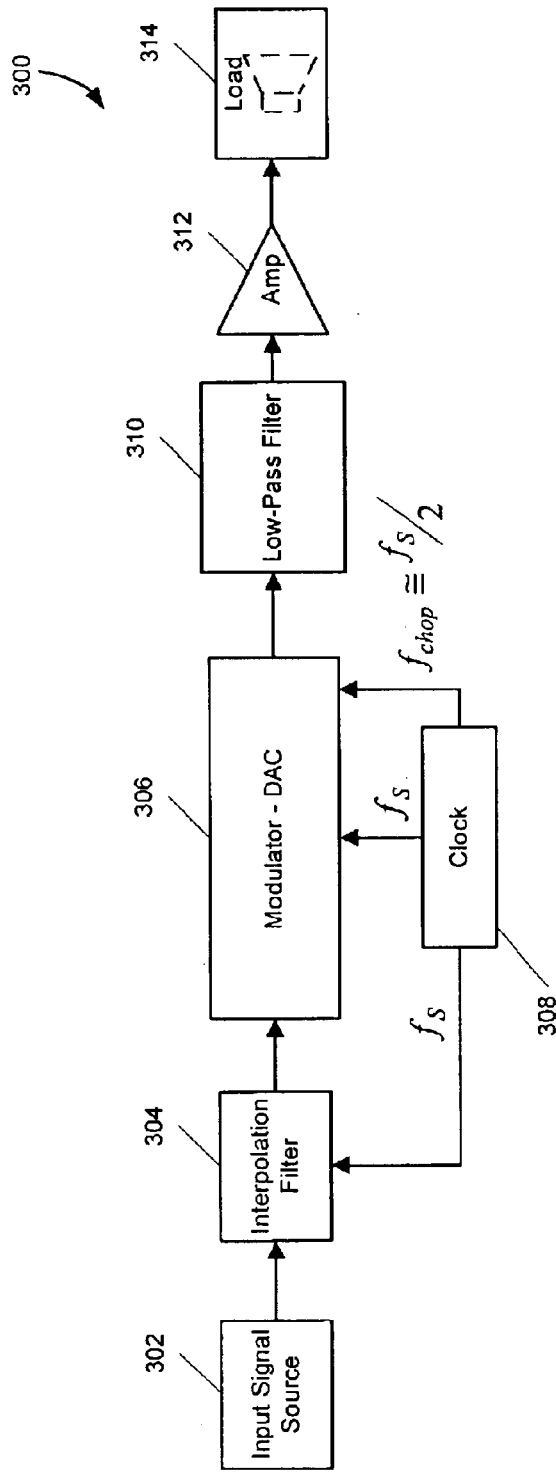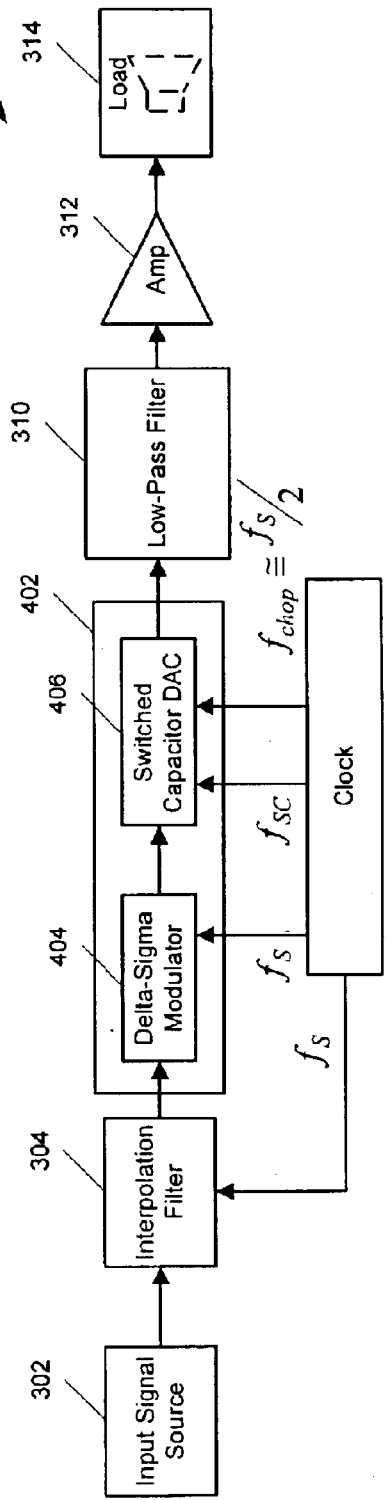
Figure 3
Figure 4

… … …

SIGNAL PROCESSING SYSTEM WITH BASEBAND NOISE MODULATION AND NOISE FOLD BACK REDUCTION

CROSS-REFERENCE TO RELATED APPLICATION

This application claims the benefit under 35 U.S.C. §119(e) of U.S. Provisional Application No. 60/441,296, filed Jan. 21, 2003 and entitled "Segmented Chopping Amplifier".

BACKGROUND OF THE INVENTION

1. Field of the Invention

The present invention relates in general to the field of signal processing, and, more specifically, to a system and method for modulating baseband noise and reducing noise that occurs, in part, due to non-ideal system properties that mix noise into a baseband via fold back mechanisms.

2. Description of the Related Art

Many electronic systems employ signal processing technology to process analog, digital, or a mix of analog and digital signals. Components used to implement signal processing technology often generate unwanted noise. For example, digital-to-analog converters (hereinafter, "DAC") are widely used to convert digital signals into analog signals. In the process of conversion, DACs often generate noise through, for example, quantization errors ("quantization noise") and low frequency 1/f noise.

In audio applications, the digital to analog conversion process often involves oversampling a digital signal, modulating the signal using a delta-sigma modulator to shape noise associated with the digital signal, and performing a digital to analog conversion using a low-pass filter. The filtered output signal is generally amplified to produce an analog signal suitable for driving a load. Delta-sigma modulators receive an input signal and convert the signal into a series of binary pulses having an average amplitude over time proportional to the input signal. In the process of producing a modulated output signal, delta-sigma modulators introduce quantization noise into the modulated input signal. However, the quantization noise advantageously resides outside of the audio baseband where frequency components of interest reside, i.e. between about 0 Hz and above about 20–25 kHz. Nevertheless, some post modulation processing, such as a post-modulation digital to analog conversion and low pass filtering, introduces noise into the audio baseband.

One common type of noise generated in post modulation processing circuits, such as metal oxide semiconductor gain stages, is 1/f noise which, as the nomenclature implies, has relatively high energy at low frequencies that rapidly diminishes at higher frequencies. Analog filters often include one or more gain stages that introduce 1/f noise. A modulation technique referred to as "chopping" has been implemented in conventional technology to modulate 1/f noise out of the audio baseband.

FIG. 1 depicts a chopping circuitry and amplifier 100, which is utilized as a component in many well-known circuits such as switched capacitor digital to analog converters. The input signal, $x_1(t)$ is modulated by chopper circuit 102 at a chopper control signal c(t) frequency of, $f_{chop}$. FIG. 2A depicts modulated input signal $X_1(f)$ in the frequency domain, centered on $f_{chop}$, and harmonics of $f_{chop}$. The amplitude of the modulated input signal $X_1(f)$ decreases with 1/n, where n is the harmonic number. The baseband of $X_1(f)$ extends to frequency $f_B$, which in audio applications is about 20–25 kHz. The 1/f noise is added to the modulated input signal $x_1(t)$ after chopping.

FIG. 2B illustrates the 1/f noise in the frequency domain. As mentioned above, the energy of the 1/f noise is primarily located within low frequencies, including the baseband of audio signals. Gain stage 104, which may be part of a larger circuit (not shown), such as a low pass filter, amplifies the modulated input signal $x_1(t)$ and 1/f noise.

Chopper circuit 106 demodulates the output signal of gain stage 102 at the frequency of chopper signal c(t) to produce output signal $x_2(t)$. FIG. 2C depicts signal $x_2(t)$ and the 1/f noise signal in the frequency domain.

The demodulation of signal $x_1(t)$ moves the output signal of interest, $x_2(t)$, in the frequency domain back to the baseband and centers the 1/f noise at $f_{chop}$ and harmonics thereof, thus out of the baseband. In an audio application, a low pass filter (not shown) attenuates signals having frequency components of $x_2(t)$ outside $f_B$.

U.S. Pat. No. 4,939,516 issued Jun. 3, 1990 and entitled "Chopper Stabilized Delta-Sigma Analog-to-Digital Converter", Early et al inventors (hereinafter, "Early"), and U.S. Pat. No. 5,039,989 issued Aug. 13, 1991 and entitled "Delta-Sigma Analog-to-Digital Converter with Chopper Stabilization at the Sampling Frequency," Welland et al inventors (hereinafter, "Welland"), describe conventional applications of chopping in analog-to-digital converters (hereinafter, "ADC"). Early and Welland proposed solutions using chopping circuitry to address 1/f and other noise issues that are particularly unique to ADCs.

Early proposed synchronizing a chopping frequency with an analog input signal sampling frequency and a digital filter. Early selected a chopping frequency equal to one-half of an analog input signal sampling frequency so that the chopping frequency would be in the rejection portion of the digital filter's frequency response. Early considered such synchronization to be important because the digital filter was able to provide a rejection of the 1/f noise that was modulated to the chopping frequency. See, for example, Early, col. 8, lns. 37–64.

Welland recognized that, in an ADC, choosing a chopping frequency equal to one-half of the sampling frequency of an analog input signal can actually increase the modulation of noise into an input signal's baseband. Thus, Welland selected a chopping frequency equal to the sampling frequency of the analog input signal. Welland included an analog modulator with at least one stage of amplification having a frequency response that provides a substantial amount of attenuation at the sampling frequency of the analog modulator in the Welland design. Thus, the amplification stage attenuates 1/f noise, which is shifted up in frequency by chopping to the sampling frequency.

DACs are in many ways very different from ADCs. Consequently, chopping frequencies of DACs are selected for different reasons than ADCs. Conventional technologies implement chopping in DACs at a chopping frequency that is as low as possible relative to a digital sampling frequency. The DAC chopping frequency is conventionally chosen just high enough to shift 1/f noise out of the baseband of the input signal in order to minimize parasitic effects associated with chopping circuitry.

SUMMARY OF THE INVENTION

In one embodiment of the present invention, a digital to analog converter system includes a digital to analog converter ("DAC") to (i) receive a digital input signal, sampled at frequency $f_S$ and having frequency components primarily within a frequency baseband, and out of baseband noise and to (ii) convert the digital input signal into a representative analog signal. The DAC includes a modulation circuit having a modulation frequency of approximately or equal to $f_S/2$ to modulate the digital input signal by approximately or equal to $f_S/2$ and a gain stage coupled to the modulation circuit to receive signals modulated by the modulation circuit and provide gain for the DAC, wherein during operation the gain stage is associated with noise having frequencies within the baseband. The DAC further includes a demodulation circuit, coupled to the gain stage and having a demodulation frequency equal to approximately or equal to $f_S/2$, to demodulate signals and allow frequency components of the input signal to fold back into the baseband, to reduce fold back into the baseband of the quantization noise frequency components, and modulate the noise associated with the gain stage substantially out of the baseband.

In another embodiment of the present invention, a method of converting a digital input signal, sampled at a frequency $f_S$ and having frequencies within a baseband, into a representative analog signal, modulating out of the baseband low frequency noise components associated with a digital to analog converter ("DAC") gain stage, and reducing fold back of quantization noise, frequency components residing outside the baseband, the method includes modulating a DAC input signal, which is derived from the digital input signal and the quantization noise by a modulation frequency of approximately or equal to $f_S/2$. The method further includes providing the modulated DAC input signal to the DAC gain stage. The method also includes demodulating output signals of the DAC gain stage by a demodulation frequency of approximately or equal to $f_S/2$ to allow frequency components of the input signal to fold back into the baseband, to prevent fold back into the baseband of the quantization noise frequency components, and modulate the noise associated with the gain stage substantially out of the baseband.

In another embodiment of the present invention, an audio system includes a digital audio signal source. The audio system further includes a digital to analog converter ("DAC") to (i) receive a digital input signal from the digital audio signal source, sampled at frequency $f_S$ and having frequency components primarily within a frequency baseband, and out of baseband noise and to (ii) convert the digital input signal into a representative analog signal. The DAC includes a modulation circuit having a modulation frequency of approximately or equal to $f_S/2$ to modulate the digital input signal by approximately or equal to $f_S/2$ and a gain stage coupled to the modulation circuit to receive signals modulated by the modulation circuit and provide gain for the DAC, wherein during operation the gain stage is associated with noise having frequencies within the baseband. The DAC also includes a demodulation circuit, coupled to the gain stage and having a demodulation frequency equal to approximately or equal to $f_S/2$, to demodulate signals and allow frequency components of the input signal to fold back into the baseband, to reduce fold back into the baseband of the quantization noise frequency components, and modulate the noise associated with the gain stage substantially out of the baseband. The audio system also includes an amplifier coupled to the DAC and an audio output device coupled to the DAC.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 1 (prior art) depicts an amplifier and chopping circuitry.

FIGS. 2A, 2B, and 2C depict signals associated with the amplifier and chopping circuitry of FIG. 1 in the frequency domain.

FIG. 3 depicts a digital signal processing system that includes a digital to analog converter with chopping circuitry operating at approximately one-half of a digital input signal sampling frequency.

FIG. 4 depicts the digital signal processing system of FIG. 3 with a switched capacitor digital to analog converter having chopping circuitry.

DETAILED DESCRIPTION

Figure 5:
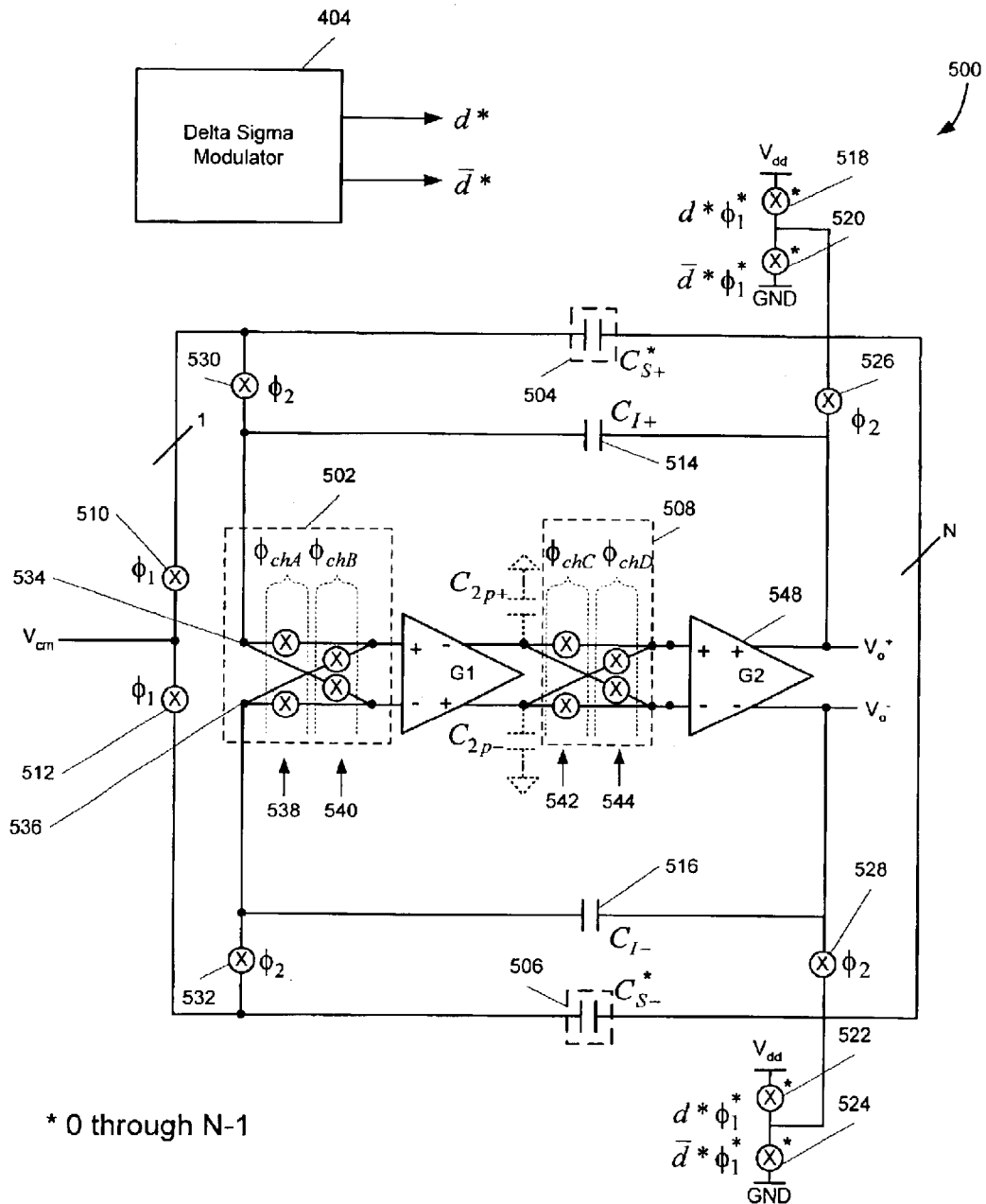
FIG. 5 depicts an embodiment of the switched capacitor digital to analog converter of FIG. 4.

Signal processing technology operates on analog, digital and mixed signals (analog and digital). For example, audio signals, representing a signal of interest and having frequency components residing within a baseband, begin as analog signals and are often digitized through sampling, and converted back into analog output signals using a digital-to-analog converter (DAC). Audio frequency analog output signals produce sound through a loud speaker, headphones, or other output device. Embodiments of the DAC system described herein utilize chopping modulation technology to remove 1/f and other baseband noise from a baseband of a signal of interest. In some embodiments, the chopping frequency is carefully selected to reduce noise fold back into the baseband. Additionally, one or more notch filters are implemented to address parasitic modulation and associated noise fold back associated with non-ideal system properties, such as parasitic impedances. For example, a notch filter reduces the fold back of the noise into the baseband from modulation at the chopping frequency and harmonic frequencies thereof.

High performance digital signal processing systems, described in more detail below, are particularly sensitive to noise, even low levels of noise. In one embodiment, to address such noise concerns a digital to analog converter ("DAC") includes chopping circuitry. Chopping circuitry in general when combined with non-ideal (i.e. real-world)

circuit components includes as a byproduct the fold back of noise frequency components into the baseband. Noise frequency components in a baseband of a signal of interest are generally undesirable. Chopping often results in the fold back of such noise into a baseband of a digital input signal due to modulation caused by non-ideal properties of the digital signal processing systems. In systems that generate noise outside the baseband, such as quantization noise, the folding back of noise into the baseband due to parasitic modulation can be very detrimental to the quality of a signal of interest. This fold back of noise is a concern having no counterpart in conventional analog to digital converter technology.

A digital signal processing system that includes a DAC with chopping circuitry operating at a chopping frequency equal to or approximately equal to one-half of a digital input signal sampling frequency addresses noise fold back concerns due to parasitic modulation at twice the chopping frequency, $2f_{chop}$. Chopping at one-half the sampling frequency results in fold back into the baseband of frequency components of the input signal itself, rather than noise components. In a further embodiment, a notch filter inserts zeros into the frequency response of the DAC at the chopping frequency and harmonics. The notch filter is preferably designed to have an attenuation band at least equal to the baseband of an input signal of interest. The notch filter also assists in preventing fold back of noise into a baseband of the input signal of noise modulated at $f_{chop}$. The various chopping signals are also preferably coordinated to reduce the generation of additional noise within the system.

FIG. 3 depicts digital signal processing system 300. Digital signal processing system 300 represents one embodiment of a system that benefits from setting a chopping frequency $f_{chop}$ equal to one-half a signal sampling frequency, $f_S$. In one embodiment, digital signal processing system 300 is an audio system for receiving, processing, and providing audio output signals. Input signal source 302 provides a digital input signal from any signal source, such as a compact disk player, MP3 player, audio/video system, or other audio recording and/or playback device. An interpolation filter 304 performs oversampling functions in a well-known manner on the digital input signal received from the input signal source 302. The interpolation filter 304 has a sampling frequency, $f_S$, provided by clock 308. The modulator-DAC 306 processes the interpolated digital input signal to convert the digital input signal into an analog signal. The modulator-DAC 306 also includes chopping circuitry to modulate noise, such as 1/f noise out of a baseband of the digital input signal. Clock 308 provides various control signals to modulator-DAC 306 as described below. In general, clock 308 provides a clock signal having a frequency of $f_S$ to modulator-DAC 306 and provides various chopping signals that have a frequency $f_{chop}$ equal or approximately equal to $f_S/2$. As will become evident, it is preferable that $f_{chop}$ equal $f_S/2$ exactly. However, variations in timing are generally inevitable in real systems due to factors such as non-ideal components and parasitic impedances. To avoid repeating "approximately" throughout this description unless otherwise indicated, references to "equal" in the context of $f_{chop}$ equal $f_S/2$ mean "approximately equal or equal".

A low pass filter 310, generally having a corner frequency at or about the corner frequency, $f_B$, of the baseband of the input signal, attenuates output signal frequency components outside the baseband. A filtered output signal from low pass filter 310 is generally amplified before being provided to load 314, especially when driving a low impedance load.

Thus, amplifier 312 amplifies the filtered output signal and provides the signal to load 314. Although load 314 may be any load, in audio applications, load 314 represents, for example, loud speakers, headphones, and other sound producing devices.

FIG. 4 depicts digital signal processing system 400, which is one embodiment of the digital signal processing system 300. The modulator-DAC 402 implements modulator-DAC 306 with a delta-sigma modulator 404 and a switched capacitor DAC 406. In one embodiment, the delta-sigma modulator 404 provides a series of multi-bit output signals to switched capacitor DAC 406. The output signals of delta-sigma modulator 404 have an average value over a predetermined time equal to the digital input signal plus quantization error. "Delta-sigma modulator" and "sigma-delta modulator," a commonly used term, are interchangeable terms for purposes of this specification. The delta-sigma modulator is clocked at $f_S$. The frequency $f_S$ is selected based upon the particular application of digital signal processing system 400. In audio applications, frequency $f_S$ is, for example, 6.144 MHz, which reflects a 128 bit word representation of an audio signal originally sampled at 48 kHz. The frequency spectrum of the quantization noise generated by delta-sigma modulator 404 resides primarily outside of an audio frequency baseband, approximately 0 to 25 kHz. The quantization noise represents one example of noise that has frequency components that can fold back and mix with a signal of interest in the baseband when using conventional technology.

FIG. 5 depicts a multibit, switched capacitor DAC 500, which is one embodiment of switched capacitor DAC 406. Any DAC could substitute for switched capacitor DAC 406. Switched capacitor DAC 500 includes modulating chopping circuitry 502, which modulates the input signal provided by delta-sigma modulator 404. Switched capacitor DAC 500 includes demodulating chopping circuitry 508, which demodulates the output signal of gain stage G1.

Many well-known hardware, software, and hardware-software combinations can be used to provide an input signal to switched capacitor DAC 500 that corresponds to an output signal of delta-sigma modulator 404. In one embodiment, capacitor banks 504 and 506 each contain an identical number of "N" parallel coupled, corresponding sampling capacitors, collectively referred to as $C_{S+}$ (504) and $C_{S-}$ (506). Each sampling capacitor in capacitor bank 504 is charged in accordance with one-bit of each N-bit word in the delta sigma modulator 404 output signal. The same charging scheme applies to capacitor bank 506. Capacitors associated with the same bit within capacitor banks 504 and 506 are referred to herein as "corresponding capacitors".

Figure 6:
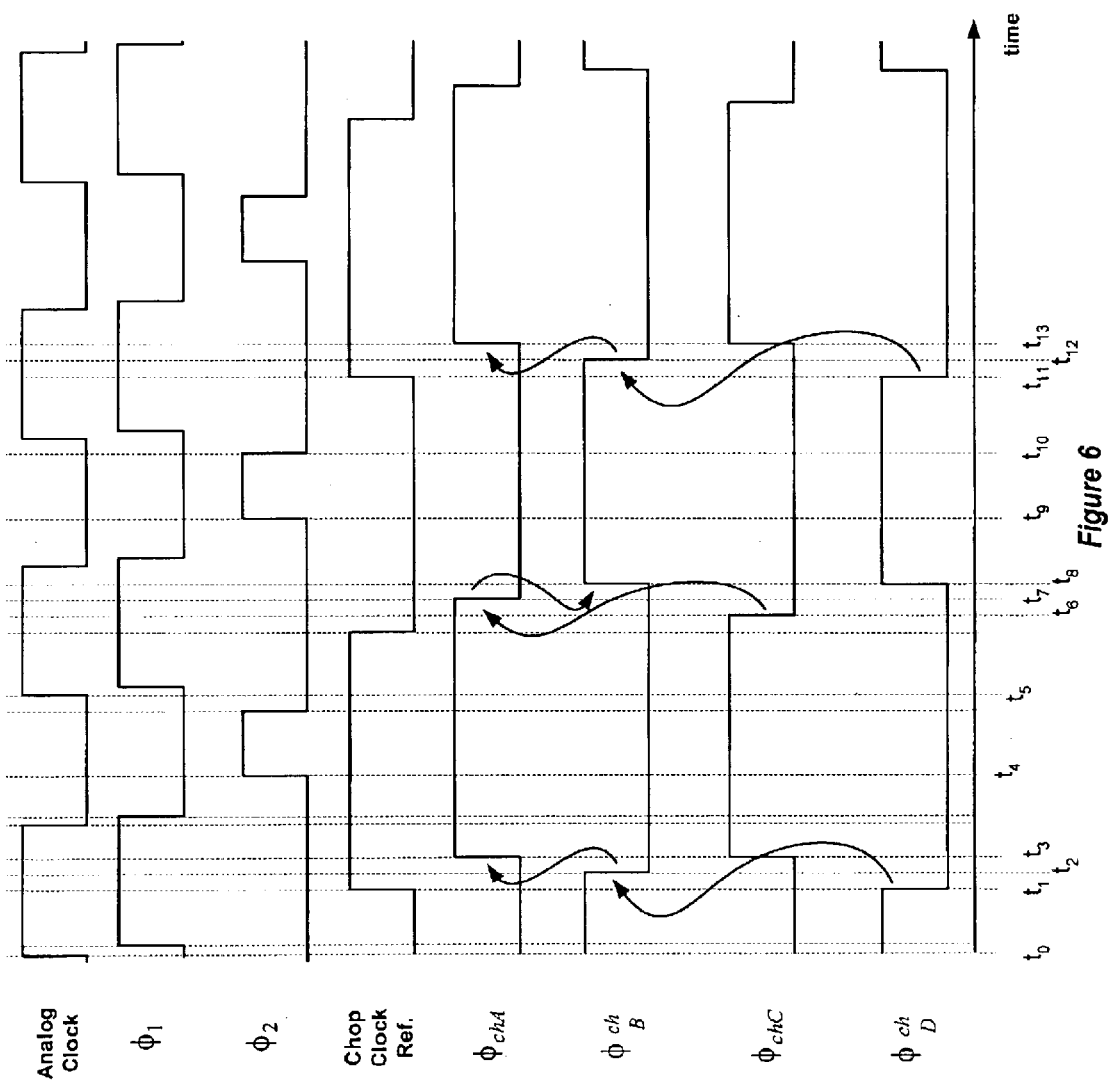
FIG. 6 depicts clock and control signals associated with the switched capacitor digital to analog converter of FIG. 6.

The switched capacitor DAC 500 operates in accordance with the control signals depicted in FIG. 6. In this embodiment, all of the control signals are generated with reference to an analog clock signal. The control signals, including chopping circuitry control signals, are preferably phase-shifted relative to the analog clock signal and relative to each other to allow settling of components and to minimize the inclusion of switching noise into the signal being processed. Settling time is dependent upon specific component value and other design considerations well-known to those of ordinary skill in the art. As will be described in more detail below, it has been identified that while the inclusion of chopping circuitry 502 and 508 addresses some low frequency noise concerns (e.g. 1/f noise) within the baseband, a concern arises due, for example, to potential fold back into the baseband of noise, such as quantization noise, and consequential corruption of the signal of interest due to parasitic modulation at frequencies $f_{chop}$ and harmonics thereof and $2f_{chop}$ and harmonics thereof.

The operation of switched capacitor DAC 500 is now described in conjunction with the control signals depicted in FIG. 6. Beginning at time t0, after the analog clock rises and a sufficient time has been allocated to allow circuits to settle, control signal $\phi_1$ rises for a sufficient time to cause switches 510 and 512 to conduct and short one plate of Cs+ 504 and Cs− 506 sampling capacitors to the common mode voltage Vcm. The sampling capacitors Cs+ 504 and Cs− 506 are charged to Vdd through respective switches 518 and 522 or discharged to ground GND, in accordance with the value of d* and $\bar{d}$* associated with each sampling capacitor, through respective switches 520 and 524 while control signal $\phi_1$ is HIGH. Each value of d represents the ith bit of the N-bit output word, and $\bar{d}$ represents the complement of d, $0 \leq i \leq N-1$, where N is the number of bits in an output word of delta sigma modulator 404. Each of switches 518, 520, 522, and 524 represent N respective switches, one for each of the N bits in the delta sigma modulator 404 N-bit output word, where N is, for example, 16.

After sampling capacitors $C_{S+}$ 504 and $C_{S-}$ 506 are charged in accordance with the modulated output signal of delta sigma modulator 404, control signal $\phi_2$ causes switches 526, 528, 530 and 532 to conduct and transfer charge to integrating capacitors $C_1$+ 514 and $C_1$− 516.

The operational phases of switched capacitor DAC 500 are summarized in Table 1:

TABLE 1

| Control Signal ID and State* | Switched Capacitor DAC 500 Operational Phase |
|---|---|
| $\phi_1$ - HIGH | Charge |
| $\phi_2$ - HIGH | Dump |

*"HIGH" represents a conduction control state and "LOW" represents a non-conduction control state. The polarities can be reversed in other embodiments.

Chopping circuitry 502 modulates the DAC input signal at input terminals 534 and 536 and chopping circuitry 508 demodulates the output signal of gain stage G1. The chopping modulation and demodulation operations are summarized in Table 2:

TABLE 2

| Chopping Circuitry | Chopping Circuitry Operational Phase |
|---|---|
| Chopping Circuitry 502 | Modulation |
| Chopping Circuitry 508 | Demodulation |

Chopping modulation and demodulation circuitry use direct and cross-over switches to modulate low frequency noise, such as 1/f noise, out of a signal baseband. Chopping circuits are particularly useful with low frequency baseband applications such as audio applications. In one embodiment, the direct switches coupled to respective input and output terminals of a differential amplifier have nonoverlapping conduction phases with cross-over switches coupled to the terminals of the differential amplifier. Additionally, the direct switches coupled to the respective input and output terminals have different duty cycles with respect to each other, and the cross-over switches coupled to the respective input and output terminals of the differential amplifier have different duty cycles with respect to each other to reduce noise transfer to an output of the system.

Referring to FIGS. 5 and 6, control signals $\phi_{chA}$ and $\phi_{chB}$ of chopping circuitry 502 are non-overlapping to prevent signal corruption, preferably square waves (or approximations thereto), and control conduction of switches 538 and 540, respectively. Chopping circuitry 508 control signals $\phi_{chC}$ and $\phi_{chD}$ are also non-overlapping to prevent signal corruption, preferably square waves (or approximations thereto), and control conduction of switches 542 and 544, respectively. A rise of control signal $\phi_{chA}$ at time $t_3$ causes direct switches 538 to conduct and pass-through the delta-sigma modulated input signal at input terminals 534 and 536 straight to gain stage G1 during the first depicted Dump phase occurring from $t_4$ to $t_5$. Direct switches 542 also conduct at time $t_3$, and, during the first Dump phase gain stage G1 and pass-through an amplified output signal straight to the input terminals of gain stage G2. Control signal $\phi_{chC}$ falls at $t_6$ followed by the fall of $\phi_{chA}$ at $t_7$. The delay between turning direct switches 542 "off" (nonconducting) and turning direct switches 538 off at the input of gain stage G1 is set by control signals $\phi_{chC}$ and $\phi_{chA}$ to provide a delay sufficient to prevent the switching noise associated with switches 538 from being passed through to the outputs $V_o$+ and $V_o$−. The delay time depends on the particular implementation of the DAC and chopping circuitry. In one embodiment the delay is on the order of 5 ns. Conduction and nonconduction of switches 538, 540, 542, and 544 controlled by the edge of control signals or controlled by other properties of the control signals in a well-known manner.

At time $t_8$, prior to the beginning of the second depicted Dump phase ($t_9$ through $t_{10}$), a rise of cross-over control signals $\phi_{chB}$ following the fall of $\phi_{chA}$ causes cross-over switches 540 to conduct. The delta-sigma modulated input signal at input terminals 534 and 536 cross-over to opposite inputs of gain stage G1 during the second Dump phase. Control signal $\phi_{chD}$ falls at $t_{11}$ followed by the fall of $\phi_{chB}$ at $t_{12}$ again with a delay sufficient to prevent the switching noise associated with switches 540 from being passed through to the outputs $V_o$+ and $V_o$−. When cross-over switches 544 conduct beginning at $t_8$, gain stage G1 provides an amplified output signal crossed-over to the input terminals of gain stage G2. The demodulation phase of chopping circuit 508 ends at time $t_{12}$. At $t_{13}$, control signal $\phi_{chA}$ rises again, and the processes described above occurring between $t_3$ and $t_{12}$ repeat during operation of switched capacitor DAC 500. The timing of control signals $\phi_{chA}$, $\phi_{chB}$, $\phi_{chC}$, and $\phi_{chD}$ are achieved, in one embodiment, by using the chop clock reference signal as a reference and using delay elements to achieve the desired timing.

"$V_o$+" and "$V_o$−" represent the respective differential output signals of switched capacitor DAC 500. Gain stages G1 and G2 are dual output, fully differential operational amplifiers, which can be of any design suitable for the application to which they are applied. Other gain stage implementations may be used. Other embodiments of switched capacitor DAC 500 use a single gain stage or more than two gain stages.

DACs often contain non-ideal properties such as parasitic capacitances or timing errors. Such non-ideal properties can produce parasitic modulation, which can corrupt a signal of interest due to, for example, fold back of noise into the baseband and mixing with the signal of interest. For example, the chopping circuitry 502 and 508 in association with various parasitic capacitances as well as other non-ideal properties can cause noise to occur at $f_{chop}$, $2f_{chop}$, and odd and harmonics of $f_{chop}$ and $2f_{chop}$. For example, parasitic capacitors $C_{2p+}$ and $C_{2p-}$ cause continuous time glitches to occur at the output of switched capacitor DAC 500 at a frequency of $2f_{chop}$. The parasitic modulation caused by the glitches results in fold back into the baseband of signals at $2f_{chop}$ and harmonics. Additionally, parasitic modulation at frequency $f_{chop}$ and harmonics thereof has been observed to cause fold back of signals at $f_{chop}=f_S/2$. In one embodiment, notch filters are added at parasitic modulation frequencies to attenuate signals folded back into the baseband by parasitic modulation at $f_{chop}$.

Gain stage G2 also introduces 1/f noise. However, if the gain of gain stage G1 is relatively high, the energy level of the gain stage G2 1/f noise is relatively low.

Figure 7:
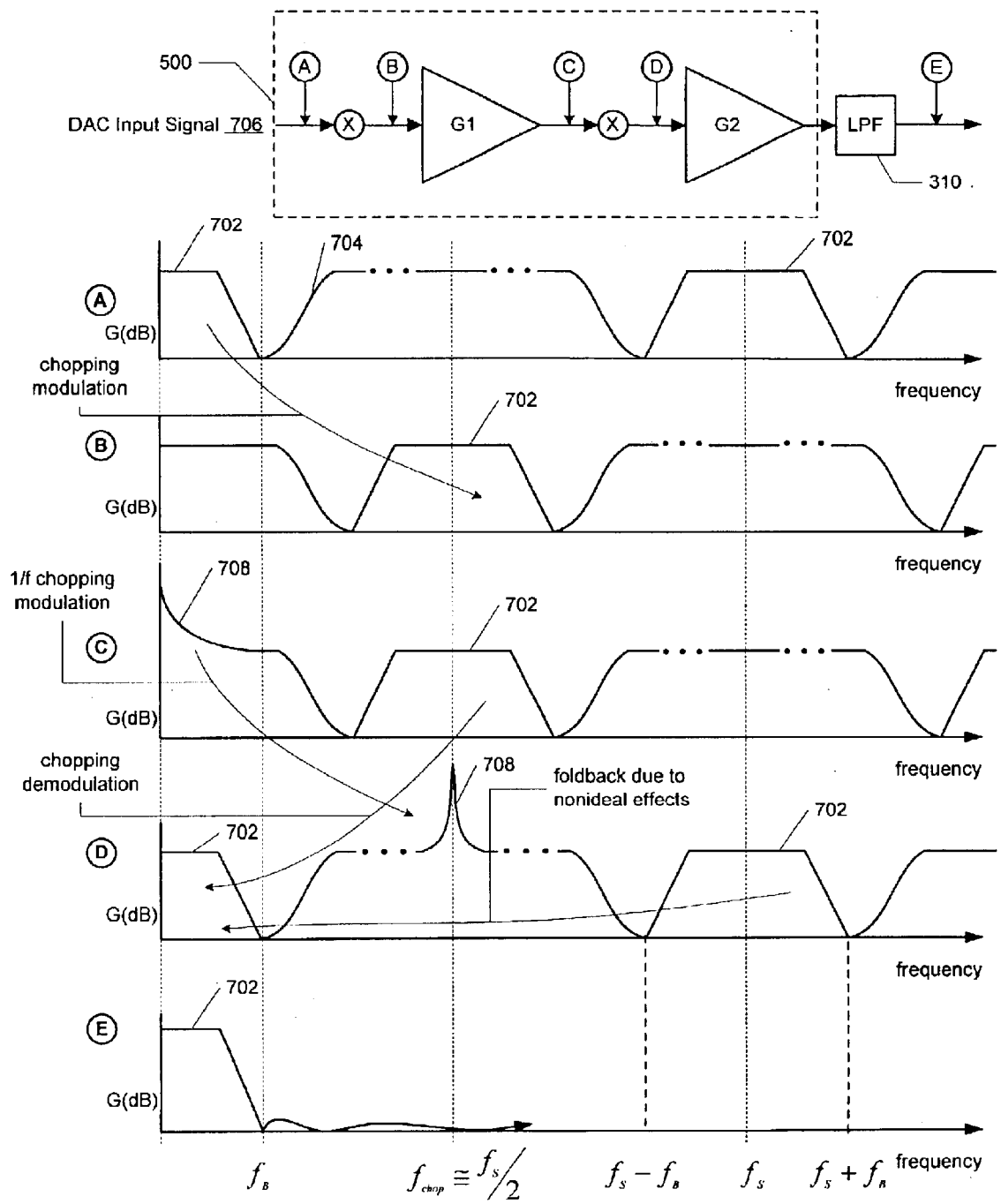
FIG. 7 depicts a frequency response of the switched capacitor digital to analog converter of FIG. 6 at various points of reference.

FIG. 7 depicts the frequency response of switched capacitor DAC 500 and low pass filter 310 at various points of reference. The frequency axis and amplitudes are not to scale, and the depiction of switched capacitor DAC 500 has been simplified to highlight points of reference in the frequency domain. Also, for clarity, FIG. 7 only depicts positive frequencies, and harmonics are not shown but are affected in the same way as their fundamental frequencies. It is understood that a mirror image of the frequency spectrums in FIGS. 7 and 13 reside at negative frequencies. In an audio application embodiment, the baseband of the input signal of interest from input signal source 302 has a bandwidth ranging from 0 Hz to $f_B$, where $f_B$ is about 25 kHz. At reference point A, frequency components of the input signal 702 from the input signal source 302 reside within the baseband, and frequency components of the quantization noise 704 from delta sigma modulator 404 reside between frequencies $f_B$ and $f_S$ minus $f_B$. The DAC input signal 706, received at input terminals 534 and 536, includes the input signal 702 and quantization noise 704. The spectrum is repeated at $f_S$ and integer multiples of $f_S$ in accordance with digital sampling theory.

Referring to reference point B, chopping circuit 502 modulates the DAC input signal 706 at reference point A by frequency $f_{chop}$, thereby transposing the frequency spectrum at reference point A up by frequency $f_{chop}$. Thus, the delta-sigma modulated input signal 702 now resides within frequencies $f_{chop}+/-f_B$ with a mirror image between $f_{chop}-f_B$ and $f_{chop}$, and some quantization noise 704 resides within the baseband. The 1/f noise 708, with higher energy levels in the baseband, is introduced and shown at reference point C. Chopping circuit 508 demodulates the signal at reference point C, thereby transposing the frequency spectrum down by $f_{chop}$ as depicted at reference point D. Thus, the modulated input signal 702 (the signal of interest) is transposed back to the baseband. During the chopping demodulation stage, the 1/f noise is modulated by $f_{chop}$, thereby transposing the 1/f noise frequency components up by $f_{chop}$ as depicted at reference point D.

As described above, parasitic modulation causes fold back into the baseband of signals having frequencies within frequencies $2f_{chop}+/-f_B$. By selecting $f_{chop}=f_S/2$, signals within frequencies $f_S+/-f_B$ are folded back into the baseband. However, the signal of interest resides at $f_S+/-f_B$. Thus, the signal of interest 702 is folded back and mixed with itself. Thus, although there may be some gain change in the input signal, there is little or no noise introduced into the baseband due to $2f_{chop}$ modulation when $f_{chop}=f_S/2$. The low pass filter 310 attenuates frequency components in the output of gain stage G2 as depicted at reference point E. As described above, non-ideal properties can cause parasitic modulation at $f_{chop}$ and harmonics. Referring to FIG. 7, quantization noise 704 resides at $f_{chop}$. Therefore, any parasitic modulation at $f_{chop}$ and harmonics causes fold back of quantization noise into the baseband.

Figure 8:
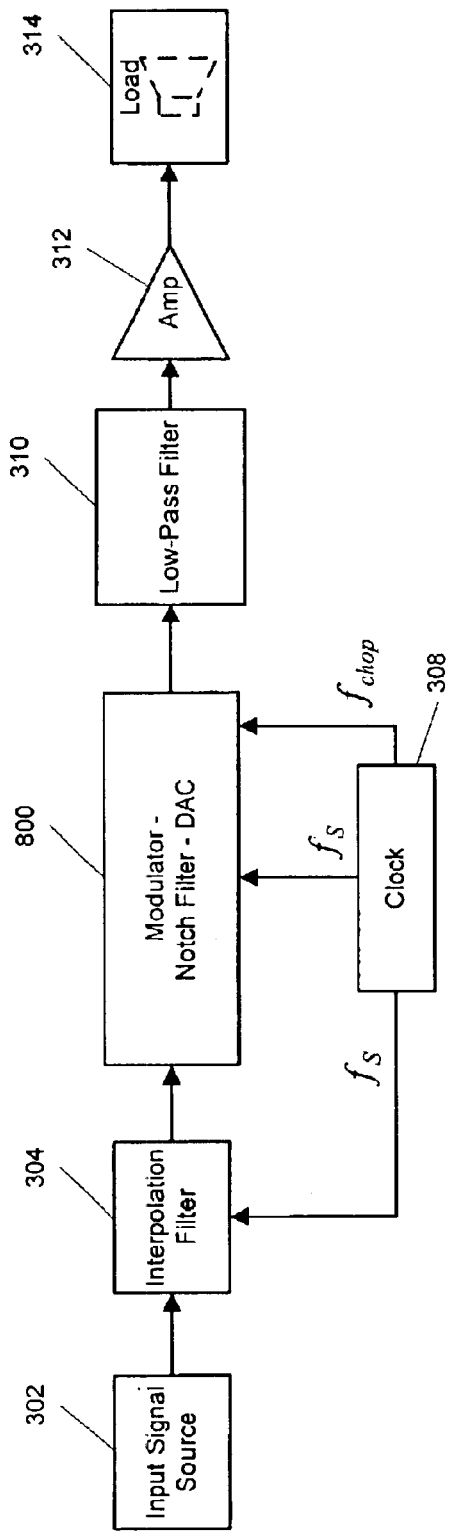
FIG. 8 depicts the digital signal processing system of FIG. 3 having a notch filter at a chopping frequency.
Figure 9:
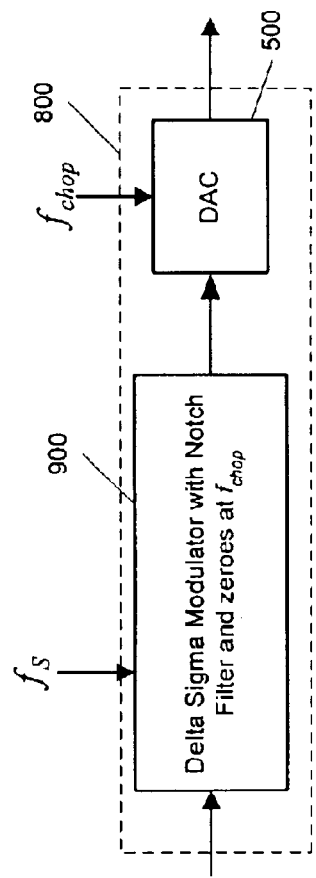
FIG. 9 depicts a modulator of the digital processing system of FIG. 8 having a notch filter at a chopping frequency included in a transfer function of the modulator.

Referring to FIG. 8, modulator-notch filter-DAC 800 represents an embodiment of modulator-DAC 306 having a notch filter to attenuate frequency components within $f_{chop}+/-f_B$ prior to chopping. Thus, fold back of noise signals within frequencies $f_{chop}+/-f_B$ into the baseband is reduced in direct relation to the attenuation of noise within frequencies $f_{chop}+/-f_B$.

Figure 10:
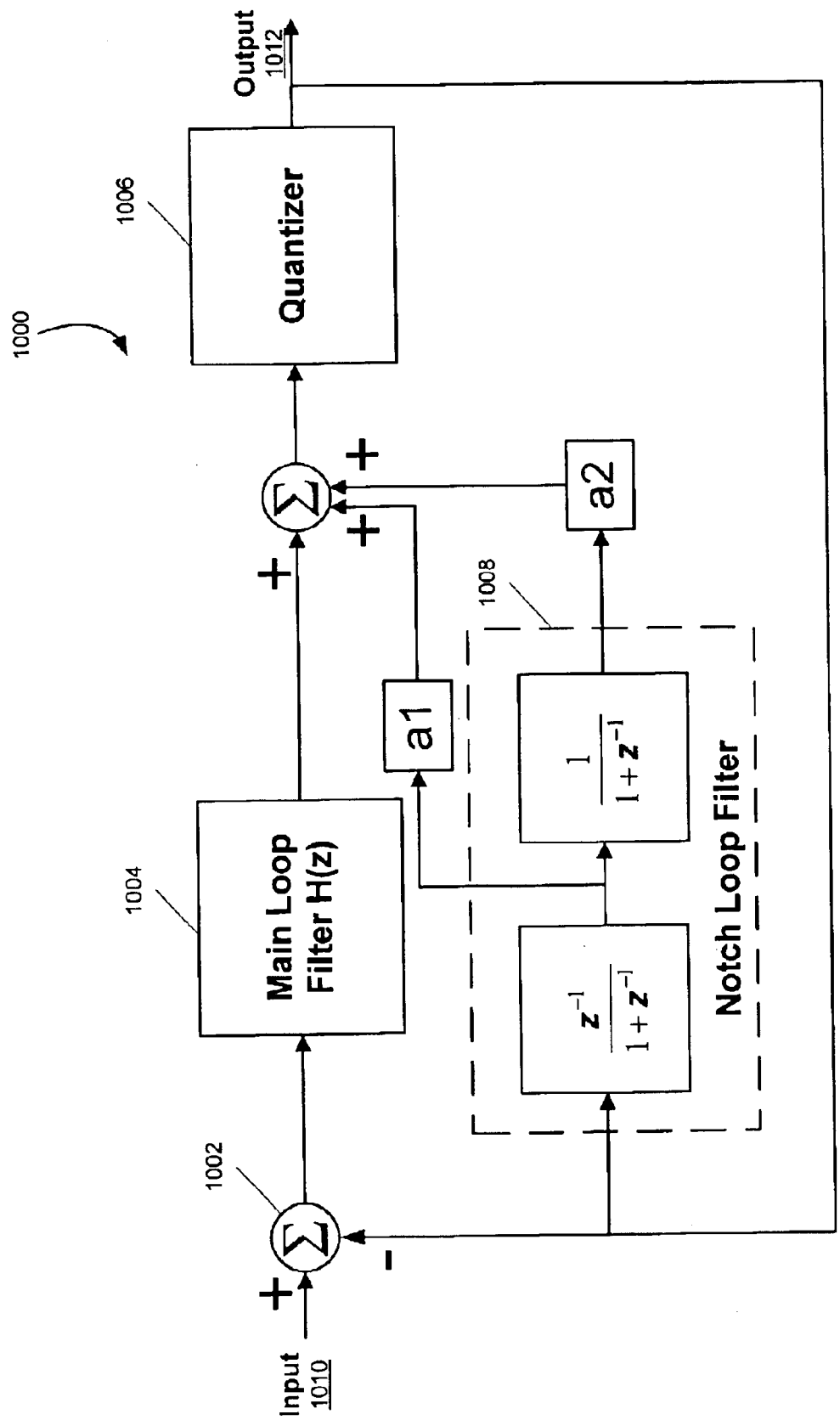
FIG. 10 depicts an embodiment of the modulator with the notch filter of FIG. 9.
Figure 11:
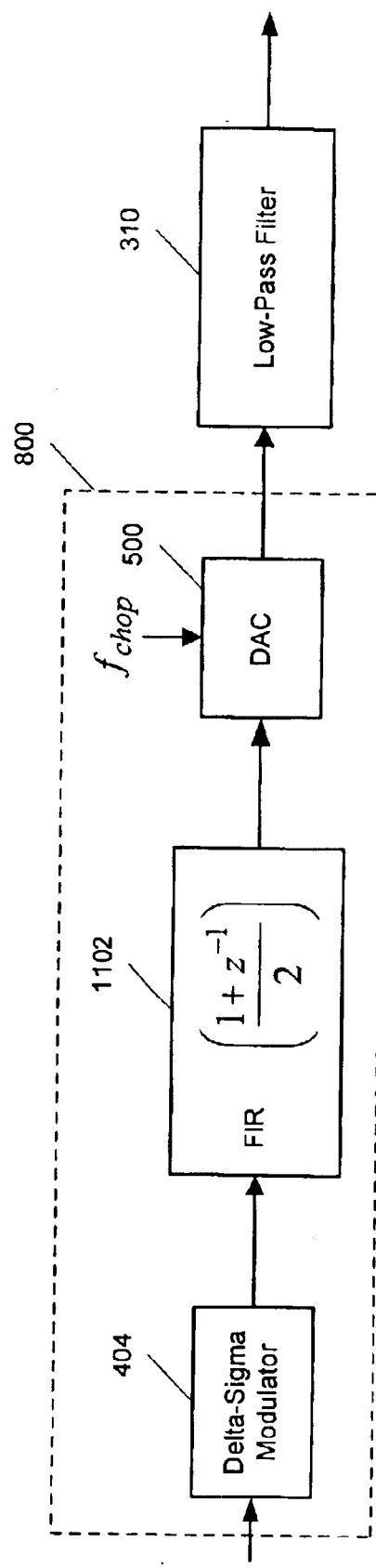
FIG. 11 depicts the digital processing system of FIG. 8 with a post-modulation, pre-DAC digital notch filter.

Referring to FIGS. 10 and 11, the notch filter of modulator-notch filter-DAC 800 is implemented within the digital signal processing system 400. The delta-sigma modulator 900 includes a conventional summing node 902 to sum a received input signal and the negative of the quantizer feedback output signal 1012. The delta-sigma modulator 1000 also includes a first order main loop filter H(z) 904 for noise shaping. The main loop filter H(z) 1004 is modified by adding a parallel notch loop filter 1008. The notch loop filter 1008 has transfer functions $z^{-1}/(1+z^{-1})$ with gain a1 and notch characteristics and $1/(1+z^{-1})$ with gain a2. Coefficients of the notch filter 1008 and gain are dependent on the specific application of digital signal processing system 300 and are determined in a well-known manner to provide attenuation of frequency components within frequencies $f_{chop}+/-f_B$ and harmonics.

FIG. 11 depicts another embodiment of modulator-notch filter-DAC 800 that includes a notch FIR filter 1102 implemented as a 2-tap FIR boxcar filter. Coefficients of notch FIR filter 1102 are also dependent on the specific application of digital signal processing system 300 and are determined in a well-known manner to provide attenuation of frequency components within frequencies $f_{chop}+/-f_B$ and harmonics. It will be recognized by those of ordinary skill in the art that other notch filter embodiments can be used to achieve attenuation at frequencies $f_{chop}+/-f_B$ and harmonics thereof, and, thus, prevent noise otherwise present at $f_{chop}+/-f_B$ and harmonics thereof from folding into the baseband and mixing with the signal of interest.

Figure 12:
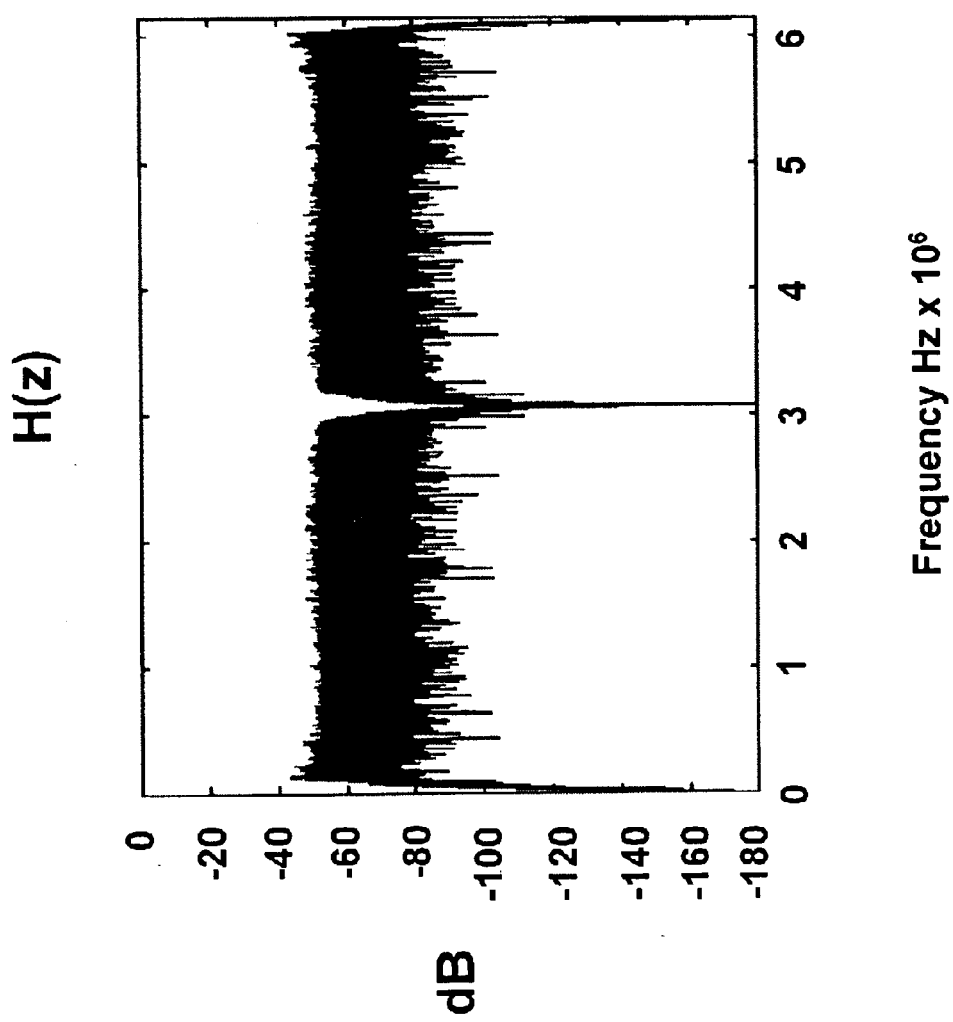
FIG. 12 depicts a frequency response of the notch filters of FIGS. 10 and 11.

FIG. 12 depicts an actual frequency spectrum plot of one embodiment of notch loop filter 908 and notch FIR filter 1102 in an audio application, where $f_S$=6.144 MHz, $f_B$=25 kHz, and $f_{chop}=f_S/2$.

Figure 13:
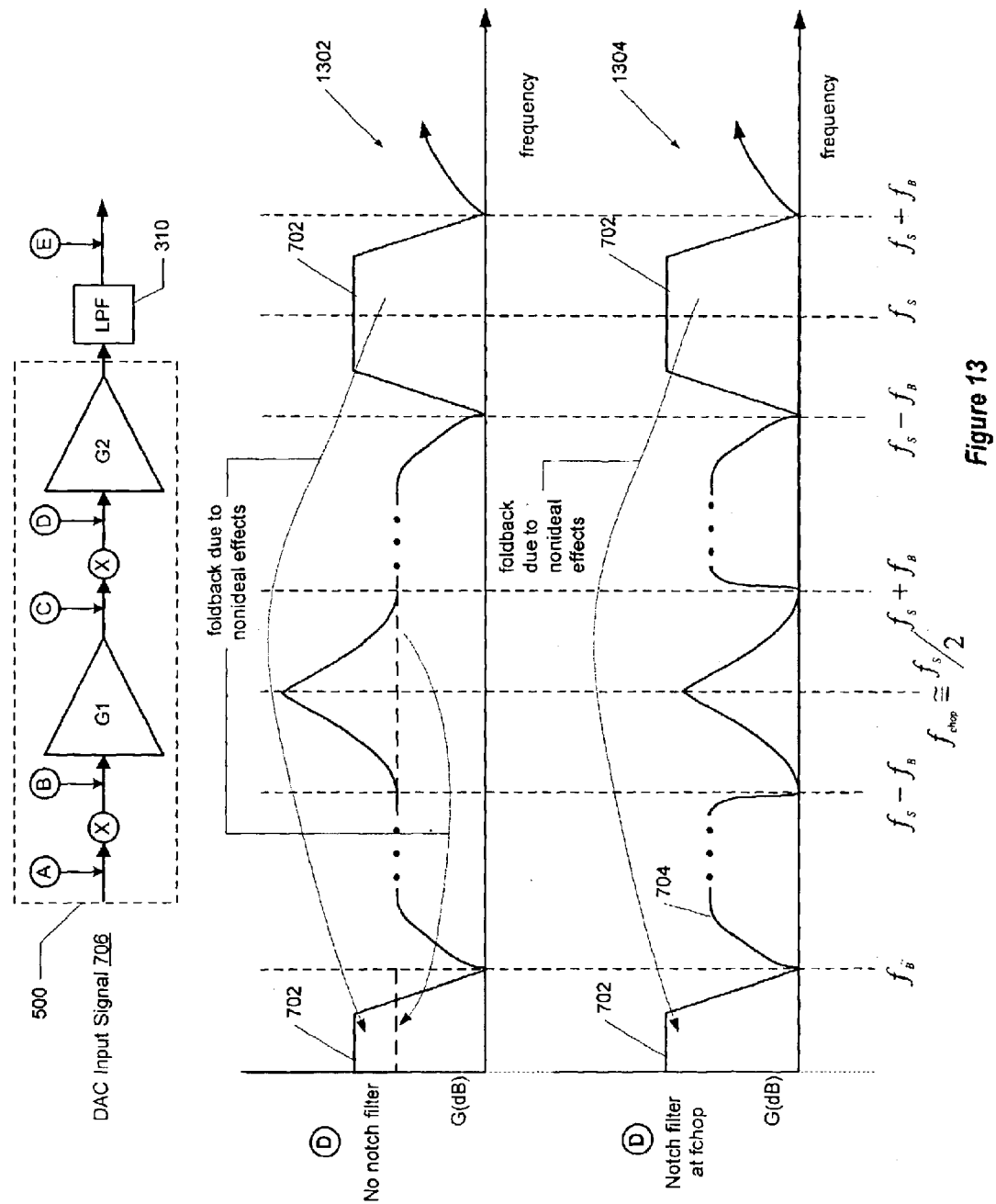
FIG. 13 depicts a frequency response of the output of the switched capacitor digital to analog converter of the system of FIG. 8 with and without notch filtering.

FIG. 13 depicts at various points of reference the frequency response of switched capacitor DAC 500 in conjunction with a notch filter of modulator-notch filter-DAC 800 attenuating frequency components within frequencies $f_{chop}+/-f_B$ and harmonics thereof and chopping at frequency $f_{chop}=f_S/2$. The frequency and amplitude axes are not to scale, and the depiction of switched capacitor DAC 500 has been simplified to highlight points of reference in the frequency domain. Also, for clarity FIG. 13 only depicts positive frequencies, and harmonics are not shown but are affected in the same away as their fundamental frequencies. In an audio application embodiment, the baseband of the input signal of interest from input signal source 302 has a bandwidth ranging from 0 Hz to $f_B$, where $f_B$ is about 25 kHz.

FIG. 13 depicts the effects of parasitic fold back of noise at frequency $f_{chop}$, with and without an attenuation band centered at $f_{chop}$. Chopping events at reference points A, B, C, and E occur as previously described with respect to FIG. 7. As described above, nonideal properties associated with DACs, such as switched capacitor DAC 500, can result in parasitic modulation at the chopping frequency $f_{chop}$ and harmonics and at $2f_{chop}$ and harmonics. The parasitic modulation at frequencies $f_{chop}$ and $2f_{chop}$ cause signals having frequencies within $f_{chop}+/-f_B$ and $2f_{chop}+/-f_B$ to fold into the baseband and mix with the signal of interest 702. The frequency spectrum 1302 illustrates the fold back of quantization noise 704 into the baseband in the absence of signal attenuation at frequencies within $f_{chop}+/-f_B$. The folded back quantization noise mixes with the signal of interest 702 and, thus, corrupts the signal of interest 702.

The frequency spectrum 1304 illustrates the attenuation of quantization noise 704 within frequencies $f_{chop}+/-f_B$ due to the presence of a notch filter, such as notch loop filter 1008 or notch FIR filter 1102. The attenuation of noise within frequencies $f_{chop}+/-f_B$ reduces or prevents, depending on the degree of attenuation and attenuation bandwidth, fold back of noise due to parasitic modulation at frequency $f_{chop}$. As described above, corruption of the signal of interest 702 due to folding at $2f_{chop}$ is avoided by setting $f_{chop}=f_S/2$ so that the signal of interest 702 is folded back upon itself. Notches can also be set at harmonics of $f_{chop}$ to prevent fold back of noise into the baseband. Furthermore, notch filters can be used to attenuate noise prior to chopping at any other parasitic modulation frequency or frequencies to prevent fold back of noise into the baseband during chopping.

Thus, the signal processing system herein provides significant noise attenuation within a baseband of interest using carefully selected chopping frequencies and/or notch filters with attenuation bands around parasitic modulation frequencies.

The signal processing systems disclosed herein can be manufactured using well-known integrated, discrete, or a combination of integrated and discrete components. Additionally software in combination with a processor can be used to implement features of the signal processing systems, such as a notch filter. Those of ordinary skill in the art will recognize that the signal processing systems disclosed herein can be implemented with a wide range of components other than those disclosed herein. For example, the digital signal modulators could be implemented using mixed signal (analog and digital) technology. Additionally, the attenuation bands of notch filters can be set to greater than, less than, or equal to $f_B$ depending on, for example, the amount of acceptable noise fold back into the baseband. Additionally, many implementations of the DAC are possible including using a single bit delta-sigma modulator in place of the multi-bit delta-sigma modulator. The multi-bit switched capacitor circuit can remain a multi-bit circuit with an accumulation of bits from the single bit delta-sigma modulator or could be a single bit circuit.

Although the present invention has been described in detail, it should be understood that various changes, substitutions and alterations can be made hereto without departing from the spirit and scope of the invention as defined by the appended claims. For example, application of the signal processing systems described herein is not limited to audio applications.

What is claimed is:

1. A digital to analog converter system, comprising:
   a digital to analog converter ("DAC") to (i) receive a digital input signal, sampled at frequency $f_S$ and having frequency components primarily within a frequency baseband, and out of baseband noise and to (ii) convert the digital input signal into a representative analog signal, the DAC comprising:
      a modulation circuit having a modulation frequency of approximately or equal to $f_S/2$ to modulate the digital input signal by approximately or equal to $f_S/2$;
      a gain stage coupled to the modulation circuit to receive signals modulated by the modulation circuit and provide gain for the DAC, wherein during operation the gain stage is associated with noise having frequencies within the baseband; and
      a demodulation circuit, coupled to the gain stage and having a demodulation frequency equal to approximately or equal to $f_S/2$, to demodulate signals and allow frequency components of the input signal to fold back into the baseband, to reduce fold back into the baseband of the quantization noise frequency components, and modulate the noise associated with the gain stage substantially out of the baseband.

2. The digital to analog converter system of claim 1 further comprising:
   a modulator, coupled to the DAC, to receive a first digital input signal sampled at a frequency, $f_S$, to modulate the digital input signal, wherein the first digital input signal includes frequency components residing within the baseband bounded by frequencies $f_1$ and $f_2$ and wherein a byproduct of the first digital input signal modulation includes quantization noise having frequency components residing outside of the baseband, wherein the input signal of the DAC is derived from the modulated first digital input signal.

3. The digital to analog converter system of claim 2 wherein $f_1$ and $f_2$ define respective high and low frequencies of an audio signal baseband.

4. The digital to analog converter system of claim 3 wherein $f_1$ is approximately or equal to 0 Hz and $f_2$ is approximately or equal to 25 kHz.

5. The digital to analog converter system of claim 2 wherein the modulator is a delta sigma type modulator, the system further comprising:
   a notch filter implemented in a feedback loop of the modulator and having a frequency attenuation band to attenuate signals having frequencies within a band folded back into the baseband by parasitic modulation.

6. The digital to analog converter system of claim 5 wherein the frequency attenuation band equals +/− a bandwidth of the frequency baseband.

7. The digital to analog converter system of claim 5 wherein the frequency attenuation band is centered at $f_S/2$.

8. The digital to analog converter system of claim 1 wherein the modulation circuit is a chopping modulator comprising series and cross-over switches to chop input signals of the gain stage, the demodulation circuit is a chopping circuit comprising series and cross-over switches to chop output signals of the gain stage, and the gain stage is a component of a fully differential amplifier.

9. The digital to analog converter system of claim 1 wherein the DAC comprises a switched capacitor digital to analog converter.

10. The digital to analog converter system of claim 9 wherein the switched capacitor digital to analog converter includes sampling capacitors to receive charge representative of the input signal, a feed back capacitor, and switches to share charge between the sampling capacitors and the feed back capacitor.

11. The digital to analog converter system of claim 1 wherein the digital input signal includes audio frequency components.

12. The digital to analog converter system of claim 1 further comprising:
   a notch filter to receive the modulated digital input signal and to provide a filtered output signal to the DAC, the notch filter having a frequency attenuation band to attenuate signals having frequencies within a band folded back into the baseband by parasitic modulation.

13. The digital to analog converter system of claim 12 wherein the frequency attenuation band equals +/− a bandwidth of the frequency baseband and is centered at $f_S/2$.

14. The digital to analog converter system of claim 12 wherein the filter is a digital finite impulse response filter implemented using hardware components.

15. The digital to analog converter system of claim 1:

wherein the modulation circuit further comprises:

input terminals to receive the digital input signal; and direct and cross-over switches coupled to alternately pass-through and cross-over a differential input signal in accordance with pass-through control signal $\phi_{chA}$ and cross-over control signal $\phi_{chB}$, wherein control signal $\phi_{chA}$ is out-of-phase with control signal $\phi_{chB}$; and the demodulation circuit further comprises:

input terminals to receive an output signal of the gain stage and alternately pass-through and cross-over the differential input signal modulated by the modulation circuit in accordance with pass-through control signals $\phi_{chC}$ and cross-over control signal $\phi_{chD}$, wherein control signal $\phi_{chD}$ is out-of-phase with $\phi_{chB}$, and control signals $\phi_{chA}$ and $\phi_{chC}$ are nonoverlapping with respect to control signals $\phi_{chB}$ and $\phi_{chD}$.

16. The digital to analog converter system of claim 15 wherein control signal $\phi_{chC}$ is configured to cause the direct switches controlled by $\phi_{chC}$ to become nonconductive prior to nonconduction of the direct switches controlled by $\phi_{chA}$, and $\phi_{chD}$ is configured to cause the direct switches controlled by $\phi_{chD}$ to become nonconductive prior to nonconduction of the direct switches controlled by $\phi_{chB}$.

17. The digital to analog converter system of claim 15 wherein control signals $\phi_{chA}$, $\phi_{chB}$, $\phi_{chC}$, and $\phi_{chD}$ are square waves.

18. A method of converting a digital input signal, sampled at a frequency $f_S$ and having frequencies within a baseband, into a representative analog signal, modulating out of the baseband low frequency noise components associated with a digital to analog converter ("DAC") gain stage, and reducing fold back of quantization noise frequency components residing outside the baseband, the method comprising:

modulating a DAC input signal, which is derived from the digital input signal, and the quantization noise by a modulation frequency of approximately or equal to $f_S/2$;

providing the modulated DAC input signal to the DAC gain stage; and demodulating output signals of the DAC gain stage by a demodulation frequency of approximately or equal to $f_S/2$ to allow frequency components of the input signal to fold back into the baseband, to reduce fold back into the baseband of the quantization noise frequency components, and modulate the noise associated with the gain stage substantially out of the baseband.

19. The method as in claim 18 wherein modulating the DAC input signal generates a noise signal having frequency components centered at $f_S/2$, the method further comprising:

filtering the modulated digital input signal to attenuate noise signal components having frequencies at $f_S/2+/-f_B$, wherein $f_B$ is a corner frequency of a bandwidth of the baseband.

20. The method as in claim 19 wherein filtering the modulated digital signal further comprises:

filtering the digital input signal using a digital finite input response notch filter.

21. The method as in claim 18 further comprising:

modulating the digital input signal, which generates the quantization noise as a byproduct of modulating the input signal.

22. The method as in claim 21 wherein modulating the DAC input signal generates a noise signal having frequency components centered at $f_S/2$, the method further comprising:

modulating the digital input signal comprises modulating the digital input signal using a delta sigma modulator; and filtering the modulated digital input signal to attenuate signal components having frequencies of approximately $f_S/2+/-f_B$, wherein $f_B$ is a corner frequency of a bandwidth of the baseband, wherein filtering the modulated digital signal further comprises filtering the modulated digital input signal within a feedback loop of the delta sigma modulator.

23. The method of claim 18 wherein the digital input signal is an audio signal.

24. The method of claim 18 wherein:

modulating the DAC input signal further comprises alternately passing-through and crossing-over the DAC input signal in accordance with pass-through control signal $\phi_{chA}$ and cross-over control signal $\phi_{chB}$, wherein control signal $\phi_{chA}$ is out-of-phase with control signal $\phi_{chB}$; and demodulating output signals of the DAC gain stage further comprises alternately passing-through and crossing-over the DAC input signal modulated by the modulation circuit in accordance with pass-through control signals $\phi_{chC}$ and cross-over control signal $\phi_{chD}$, wherein control signal $\phi_{chD}$ is out-of-phase with $\phi_{chB}$, and control signals $\phi_{chA}$ and $\phi_{chC}$ are nonoverlapping with respect to control signals $\phi_{chB}$ and $\phi_{chD}$.

25. The method of claim 24 further comprising:

ceasing the pass-through of the DAC input signal in accordance with control signal $\phi_{chC}$ prior to ceasing the pass-through of the DAC input signal in accordance with control signal $\phi_{chA}$; and ceasing the crossing-over of the DAC input signal in accordance with control signal $\phi_{chD}$ prior to ceasing the crossing-over of the DAC input signal in accordance with control signal $\phi_{chB}$.

26. An audio system comprising:

a digital audio signal source;

a digital to analog converter ("DAC") to (i) receive a digital input signal from the digital audio signal source, sampled at frequency $f_S$ and having frequency components primarily within a frequency baseband, and out of baseband noise and to (ii) convert the digital input signal into a representative analog signal, the DAC comprising:

a modulation circuit having a modulation frequency of approximately or equal to $f_S/2$ to modulate the digital input signal by approximately or equal to $f_S/2$;

a gain stage coupled to the modulation circuit to receive signals modulated by the modulation circuit and provide gain for the DAC, wherein during operation the gain stage is associated with noise having frequencies within the baseband; and a demodulation circuit, coupled to the gain stage and having a demodulation frequency equal to approximately or equal to $f_S/2$, to demodulate signals and allow frequency components of the input signal to fold back into the baseband, to reduce fold back into the baseband of the quantization noise frequency components, and modulate the noise associated with the gain stage substantially out of the baseband;

an amplifier coupled to the DAC; and an audio output device coupled to the DAC.

27. The audio system of claim 26 wherein the modulation circuit is a chopping modulator comprising series and cross-over switches to chop input signals of the gain stage, the demodulation circuit is a chopping circuit comprising series and cross-over switches to chop output signals of the gain stage, and the gain stage is a component of a fully differential amplifier.

28. The audio system of claim 26 further comprising:

a notch filter to receive the modulated digital input signal and to provide a filtered output signal to the DAC, the notch filter having a frequency attenuation band to attenuate signals having frequencies within a band folded back into the baseband by parasitic modulation.

29. The digital to analog converter system of claim 28 wherein the frequency attenuation band equals +/− a bandwidth of the frequency baseband and is centered at $f_S/2$.

* * * * *